United States Patent
Hoei et al.

(10) Patent No.: US 11,231,982 B2
(45) Date of Patent: Jan. 25, 2022

(54) READ WINDOW SIZE

(71) Applicant: Micron Technology, Inc., Boise, ID (US)

(72) Inventors: Jung Sheng Hoei, Newark, CA (US); Peter Sean Feeley, Boise, ID (US); Sampath K. Ratnam, Boise, ID (US); Sead Zildzic, Rancho Cordova, CA (US); Kishore Kumar Muchherla, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/248,538

(22) Filed: Jan. 28, 2021

(65) Prior Publication Data

US 2021/0149755 A1    May 20, 2021

Related U.S. Application Data

(63) Continuation of application No. 16/234,256, filed on Dec. 27, 2018, now Pat. No. 10,936,392.

(51) Int. Cl.
| | |
|---|---|
| *G06F 11/00* | (2006.01) |
| *G06F 11/07* | (2006.01) |
| *G11C 16/34* | (2006.01) |
| *G11C 16/26* | (2006.01) |
| *G11C 16/04* | (2006.01) |

(52) U.S. Cl.
CPC .......... *G06F 11/076* (2013.01); *G06F 11/073* (2013.01); *G06F 11/0793* (2013.01); *G11C 16/26* (2013.01); *G11C 16/3431* (2013.01); *G11C 16/0483* (2013.01)

(58) Field of Classification Search
CPC .............. G06F 11/073; G06F 11/0793; G06F 11/1016; G06F 11/3037; G06F 11/3058; G06F 11/3476
See application file for complete search history.

(56) References Cited

U.S. PATENT DOCUMENTS

| | | | |
|---|---|---|---|
| 2009/0310406 A1 | 12/2009 | Sarin et al. | |
| 2010/0296350 A1* | 11/2010 | Kim | G11C 11/5642 365/189.15 |
| 2011/0096612 A1 | 4/2011 | Steiner et al. | |
| 2015/0309856 A1* | 10/2015 | Weilemann, II | G11C 29/52 714/47.3 |

\* cited by examiner

*Primary Examiner* — Charles Ehne
(74) *Attorney, Agent, or Firm* — Lowenstein Sandler LLP

(57) ABSTRACT

A processing device in a memory system incrementally adjusts a center read voltage for a first block of a memory device by a first offset amount to generate an adjusted read voltage and causes the adjusted read voltage to be applied to the first block to determine an adjusted bit count associated with the adjusted read voltage. The processing device further determines whether a difference between the adjusted bit count and a previous bit count associated with a previous read voltage satisfies a first threshold criterion pertaining to an error threshold, and responsive to the difference between the adjusted bit count and the previous bit count not satisfying the first threshold criterion, determines a read window for the first block based on the previous read voltage.

20 Claims, 7 Drawing Sheets

US 11,231,982 B2

READ WINDOW SIZE

RELATED APPLICATION

This application is a continuation of U.S. application Ser. No. 16/234,256, filed Dec. 27, 2018, which is hereby incorporated in its entirety herein by reference.

TECHNICAL FELD

Embodiments of the disclosure relate generally to memory sub-systems, and more specifically, relate to determining a read window size for a memory component at a given voltage and bit count

BACKGROUND

A memory sub-system can be a storage system, such as a solid-state drive (SSD), or a hard disk drive (HDD). A memory sub-system can be a memory module, such as a dual in-line memory module (DIMM), a small outline DIMM (SO-DIMM), or a non-volatile dual in-line memory module (NVDIMM). A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
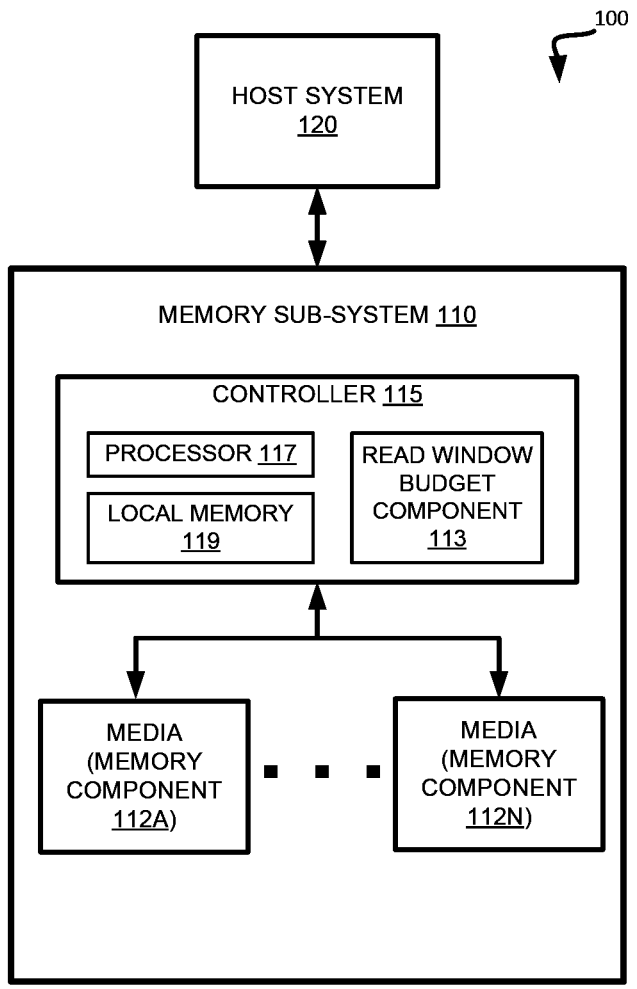
FIG. 1 illustrates an example computing environment that includes a memory sub-system in accordance with some embodiments of the present disclosure.

Aspects of the present disclosure are directed to determining a read window size for a memory component at a given voltage and bit count. A memory sub-system is also hereinafter referred to as a "memory device." An example of a memory sub-system is a storage device that is coupled to a central processing unit (CPU) via a peripheral interconnect (e.g., an input/output bus, a storage area network). Examples of storage devices include a solid-state drive (SSD), a flash drive, a universal serial bus (USB) flash drive, and a hard disk drive (HDD). Another example of a memory sub-system is a memory module that is coupled to the CPU via a memory bus. Examples of memory modules include a dual in-line memory module (DIMM), a small outline DIMM (SO-DIMM), a non-volatile dual in-line memory module (NVDIMM), etc. The memory sub-system can be, for instance, a hybrid memory/storage sub-system. In general, a host system can utilize a memory sub-system that includes one or more memory components. The host system can provide data to be stored at the memory sub-system and can request data to be retrieved from the memory sub-system.

The memory sub-system can store data at memory cells of a memory component included in the memory sub-system. Each of the memory cells can store one or more bits of binary data corresponding to the data received from the host system. In one example, the memory components of the memory sub-system can include a single-level-cell (SLC) memory where each memory cell of the SLC memory can be programmed with a single bit of data. When storing one bit of data in the SLC memory, a range of possible voltage levels of a memory cell is divided into two ranges. For example, the two ranges can include a first threshold voltage range that corresponds to the logical data value "1" and a second threshold voltage range that corresponds to the logical data value "0."

Some memory sub-systems can include higher density memory components such as multi-level-cell (MLC) memory that is programed by storing 2 bits per memory cell, 3 bits per memory cell, 4 bits per memory cell, or more bits per memory cell. Data can be stored at an MLC memory based on a total voltage range that is divided into some number of distinct threshold voltage ranges for the memory cells. Each distinct threshold voltage range corresponds to a predetermined value for the data stored at the memory cell.

One type of memory component includes a quad-level cell (QLC) memory. In QLC memory, each memory cell can store four bits of data. For example, in a QLC memory, a memory cell can store four bits of data (e.g., 1111, 0000, 1101, etc.) corresponding to data received from the host system. In QLC memory, each bit of the memory cell is stored at a different portion of the memory cell. In a memory cell for a QLC memory, each combination of four bits can correspond to a different threshold voltage range (also referred to as a "level" hereafter). For example, a first level of the memory cell can correspond to 1111, a second level can correspond to 0111, and so on. Because a memory cell for a QLC memory includes 4 bits of data, there are a total of 16 possible combinations of the four bits of data. Accordingly, a memory cell for a QLC memory can be programmed to one of 16 different levels.

Conventional storage systems can store multiple bits of data in a single memory cell by mapping a sequence of bits to each of the different voltage levels of the memory cell. For example, a particular logical data value (e.g., '1100') can be assigned to one voltage level and another logical data value (e.g., '1010') can be assigned to another voltage level of the memory cell. The data can be stored into the memory cell by using a programming operation that applies a sequence of programming pulses to the memory cell. The sequence of programming pulses can be applied to the memory cell until a voltage level corresponding to the data value has been reached at the memory cell. After the memory cell has been programmed, data can be read from the memory cell by applying a read voltage to the memory cell at the corresponding threshold voltage range and translating the programed voltage level at the memory cell.

Under certain circumstances, variations in temperature at which the memory sub-system is operated or the passage of time, such as a period of time between when data is written to a memory cell and when data is read from the memory cell, can impact the voltages stored in and read from the memory cell. For example, if a memory cell in a QLC memory is written with a voltage level of 2 V corresponding to a data value of '0100' at 25° C., and the temperature changes over time to 90° C. when the memory cell is read, the apparent voltage level may have shifted to 1.85 V. Due to the passage of time or change in temperature, electrons can fall back from the floating gate charge traps used to form the memory cell, leading to a different apparent voltage level when the memory cell is read. Depending on how the threshold voltage ranges (i.e., levels) are defined in the memory cell, the apparent read voltage may reflect a different data value (e.g., '0011'). The shift in the voltage levels can result in a meeting or overlap of the voltage distributions of two or more levels, thereby increasing the raw bit error rate (RBER), possibly beyond the error correction capability of the underlying error correction code (ECC). In addition, manufacturing variations in memory cells and memory components can cause different memory cells to be affected by the passage of time and by temperature variations in different ways. For example, one memory cell, or group of memory cells, may be exhibit a threshold voltage shift for a given temperature change that is larger than the threshold voltage shift exhibited by another memory cell, or group of memory cells, for the same change in temperature.

Conventional memory components are often sold or otherwise distributed to customers along with operational benchmarks indicating an expected level of performance. One of these benchmarks may include a period of non-operation that the memory component can tolerate. For example, if a memory component is advertised as being non-operable for up to a period of one year, a customer can expect that data stored on the memory component can still be recoverable even if the memory component has been powered off for up to one year. As described above, the voltage distribution shifts that occur due to the passage of time, changes in temperature, or other factors, are considerations when defining this operational benchmark. The space between voltage distributions representing different data values can impact how long the memory component can be non-operable. The larger the space between the voltage distributions is (also referred to herein as the size of the "read window" or the "valley width"), the more voltage shift can be tolerated, and thus the longer the period of non-operation can be. Without a reliable way to determine the read window size, defining an accurate period of time for which the memory component can be non-operable is challenging and often imprecise.

Aspects of the present disclosure address the above and other considerations by systematically determining a read window size for a memory component at a given voltage and bit count. In one embodiment, the system incrementally adjusts a read voltage (e.g., in increasing steps and decreasing steps equal to an offset amount) to determine a bit count at each adjust voltage. The bit count can represent a number of bit flips that occur for a corresponding adjusted read voltage. The system continues adjusting the read voltage in both directions, thereby forming a read window bounded by the highest and lowest adjusted read voltage until the number of bit flips occurring within the read window meets or exceeds an error correcting capability of the memory component. The largest read window size for which the number of bit flips is still less than or equal to a corresponding threshold, may be considered the maximum read window size, and may be used to determine various benchmarks associated with the memory component. For example, a determination of the maximum read window size may allow the system to issue and/or process commands indicating whether, at a given read voltage and read voltage search range, the number of bit flips within the read window range is greater than or less than a targeted count. In addition, the system can determine the maximum read window size having less than a given bit flip count at a given read voltage and read voltage search range. The techniques described herein improve the accuracy and efficiency in determining the read window size. The read window size can be used to more accurately determine when memory blocks should be refreshed, thereby causing the error rate in the memory sub-system to be decreased, deeper error correction code (ECC) recovery to be utilized less frequently, and overall performance of the memory sub-system to be improved. Additional details of these techniques are provided below with respect to FIGS. 1-7.

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. In some embodiments, the memory sub-system is a storage system. An example of a storage system is a SSD. In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory subsystem 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data. The data blocks can be further grouped into one or more planes on each of memory components 112A to 112N, where operations can be performed on each of the planes concurrently. Corresponding data blocks from different planes can be associated with one another in a stripe than spans across multiple planes.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and may instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes a read window component 113 that can be used to measure a read window for one of memory components 112A to 112N at a given voltage and bit count. In one embodiment, read window component 113 receives a memory command indicating a read window size and a first read voltage and identifies a read window for a first data block of one of memory components 112A to 112N having the read window size and centered at the first read voltage. The read window component 113 determines whether a number of bit flips for the first data block within the read window exceeds an error threshold and, in response to the number of bit flips exceeding the error threshold, refreshes data stored on the first data block of the memory component. To determine a read window, read window component 113 determines a first bit count for the first data block, wherein the first bit count is associated with a first read voltage, and determines a second bit count for the first data block, wherein the second bit count is associated with a second read voltage. The difference between the first read voltage and the second read voltage defines a read window, and can be determined by incrementally adjusting a center read voltage by a first offset amount to generate an adjusted read voltage (e.g., the first read voltage or the second read voltage). The read window component 113 determines a maximum size of the read window for which a difference between the first bit count and the second bit count is below an error threshold moves data from the first data block to a second data block of the memory component in response to the maximum size of the read window being below a read window threshold. Further details with regards to the operations of the read window component 113 are described below.

Figure 2:
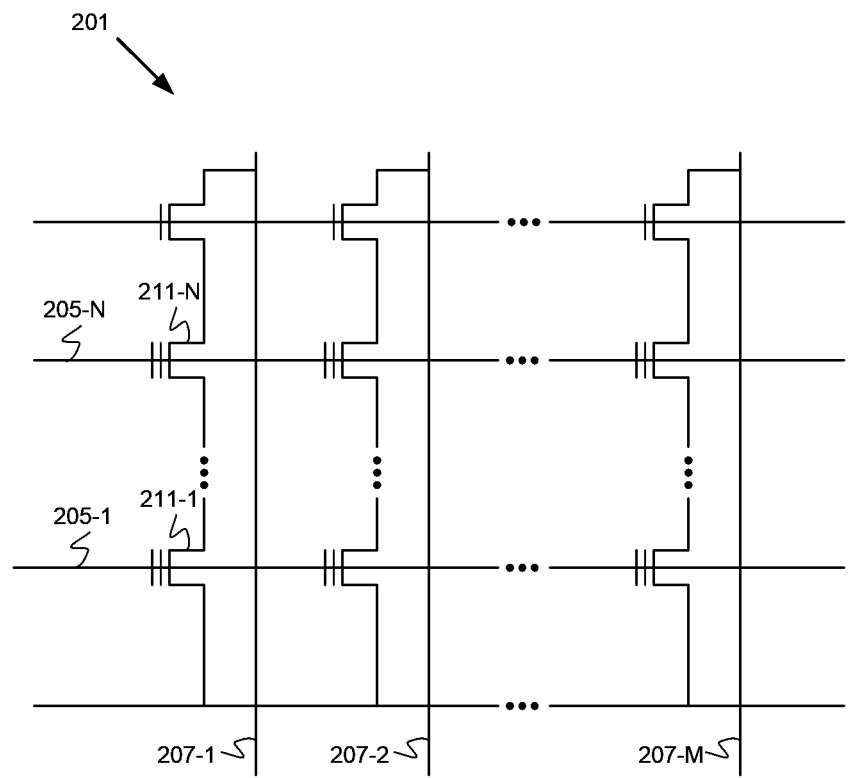
FIG. 2 illustrates a schematic diagram of a portion of a non-volatile memory in accordance with some embodiments of the present disclosure.

FIG. 2 illustrates a schematic diagram of a portion of a non-volatile memory array in accordance with a number of embodiments of the present disclosure. The memory array can be contained within memory components 112A to 112N illustrated in FIG. 1. The embodiment of FIG. 2 illustrates a NAND architecture non-volatile memory array. However, embodiments described herein are not limited to this example. As shown in FIG. 2, the memory array 201 includes access lines (e.g., word lines 205-1 to 205-N) and intersecting data lines (e.g., local bit lines 207-1 to 207-M). For ease of addressing in the digital environment, the number of word lines and the number of local bit lines can be some power of two (e.g., 256 word lines by 4,096 bit lines).

Memory array 201 includes a number of NAND strings, where each NAND string includes non-volatile memory cells 211-1 to 211-N, each communicatively coupled to a respective word line 205-1 to 205-N. Each NAND string (and its constituent memory cells) is also associated with a local bit line (i.e., one of local bit lines 207-1 to 207-M). The memory cells 211-1 to 211-N of each NAND string are coupled in series, source to drain, between a source select gate (SGS) and a drain select gate (SGD). Each source select gate is configured to selectively couple a respective NAND string to a common source responsive to a signal on source the select line, while each drain select gate is configured to selectively couple a respective NAND string to a respective bit line responsive to a signal on the drain select line.

In a number of embodiments, construction of the non-volatile memory cells 211-1 to 211-N includes a source, a drain, a floating gate or other charge storage structure, and a control gate. The memory cells 211-1 to 211-N have their control gates coupled to a word line, 205-1 to 205-N, respectively. A number (e.g., a subset or all) of cells coupled to a selected word line can be written and/or read together as a group. A number of cells written and/or read together can correspond to a page of data. As used herein, examples of high-level operations are referred to as writing or reading operations (e.g., from the perspective of a controller), whereas, with respect to the memory cells, such operations are referred to as programming or sensing. A group of cells coupled to a particular word line and programmed together to respective states can be referred to as a target page. A programming operation can include applying a number of program pulses (e.g., 16V-20V) to a selected word line in order to increase the threshold voltage (Vt) of selected cells coupled to that selected word line to a desired program voltage level corresponding to a targeted state. Read operations can include sensing a voltage and/or current change of a bit line coupled to a selected cell in order to determine the state of the selected cell. The read operation can include precharging a bit line and sensing the discharge when a selected cell begins to conduct.

According to a number of embodiments of the present disclosure, read window component 113 can determine a maximum size of a read window for which a difference between a first bit count associated with a first read voltage and a second bit count associated with a second read voltage is below an error threshold. In one embodiment, to determine the first bit count, read window component 113 applies the first read voltage to one or more of word lines 205-1 to 205-N of memory array 201 and reads an output voltage on one or more of local bit lines 207-1 to 207-M. Then, to determine the second bit count, read window component 113 applies the second read voltage to one or more of word lines 205-1 to 205-N and reads a corresponding output voltage on one or more of local bit lines 207-1 to 207-M. The difference between the first bit count and the second bit count represents a number of bit flips that the memory array experiences within a read window bounded by the first read voltage and the second read voltage. As described herein, read window component 113 may incrementally adjust the first read voltage and the second read voltage to expand the size of the read window until the maximum size is determined for which the number of bit flips is still able to be processed by error correcting code on the memory component.

Figure 3:
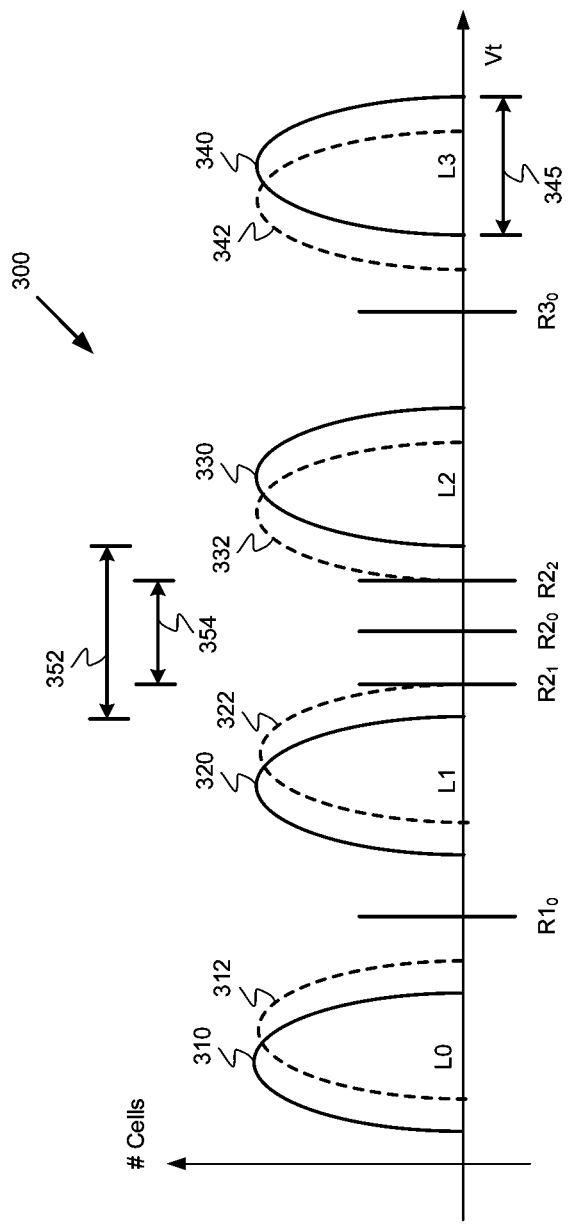
FIG. 3 illustrates a diagram of a read window size for voltage threshold distributions for programmed states in accordance with some embodiments of the present disclosure.

FIG. 3 illustrates a diagram 300 of a read window between read voltage threshold distributions for programmed states in accordance with a number of embodiments of the present disclosure. The example shown in FIG. 3 can represent, for example, memory cells in a block of one of memory components 112A to 112N, previously described in connection with FIG. 1. The example shown in FIG. 3 represents two-bit, e.g., four-state, memory cells. However, embodiments of the present disclosure are not limited to this example of two-bit memory cells.

FIG. 3 shows threshold voltage (Vt) distributions that represent four target states, e.g., L0, L1, L2, and L3, respectively, to which the memory cells can be programmed. Threshold voltage (Vt) distributions 310, 320, 330, and 340 correspond to each of the four initial target states at t=0 (e.g., immediately after programming) before charge settling occurs. Threshold voltage (Vt) distributions 312, 322, 332, and 342 (shown in FIG. 3 using dotted lines) correspond to each of the four steady state target states at t=1 mS after charge settling, which shifts the threshold voltage (Vt) distributions to either increased or decreased voltage levels. The range of voltages between distributions at a given time may be referred to as the read window. Due to the passage of time, change in temperature, etc. a shift in the voltage distributions and a change in the read window may occur. For example, at t=0, the read window between Vt distributions 320 and 330 is shown as 352, but by t=1, the read window between Vt distributions 322 and 332 has decreased and is shown as 354.

In operation, the memory cells in a selected block can be erased together such that they have a Vt level within Vt distribution 312 prior to being programmed. As such, distribution 312 can be referred to as an erased state and can represent a particular stored data state (target state L0).

Vt distributions 312, 322, 332, and 342 can represent a number of memory cells that are programmed to the corresponding target states, where the height of a Vt distribution curve indicates a number of cells programmed to a particular voltage within the Vt distribution, on average. The range 345 of the Vt distribution curve indicates the range of voltages that represent a particular target state, e.g., the range of the Vt distribution curve 340 for L3 represents the range of voltages that correspond to data 10.

A number of sensing voltages are illustrated in FIG. 3. Such sensing voltages can include initial (e.g., transitory) program verify voltages, default or center read voltage and modified read voltages. In the example illustrated in FIG. 3, voltage levels $R1_0$, $R2_0$, and $R3_0$ represent sensing voltages (e.g., read voltages) that can be used to distinguish between states L0, L1, L2, and L3 during a sensing operation. In a sensing operation performed on a selected memory cell in a NAND string, the unselected memory cells of the string can be biased with a pass voltage "Vpass" so as to be in a conducting state.

FIG. 3 also shows read voltages $R2_1$ and $R2_2$, which can be modified (e.g., reduced or increased) read voltages from the center read voltage (e.g., $R2_0$). The center read voltage (or default read voltage) can be the voltage used to perform a read operation when the charge is in a steady state, and a modified read voltage can be the voltage that results after adding an offset voltage to the center read voltage. The modified read voltages are the test voltages used to determine the size of the read window 352 or 354. The modified read voltage $R2_1$ can be reduced from a default read voltage (e.g., $R2_0$) by a pre-determined offset voltage amount and the modified read voltage $R2_2$ can be increased from a default read voltage (e.g., $R2_0$) by the pre-determined offset voltage amount. Although a modified read voltages are illustrated in FIG. 3 for only one increment in each direction along the Vt axis, the other read levels, $R1_0$, $R2_0$, and/or others, can also be adjusted in by the same or different offset voltage amounts. In addition, there may be any number of modified read voltages for the default read voltages used to determine the read window 352 or 354.

Beyond the transitory shifting of Vt due to initial charge settling after programming, the Vt of a memory cell can change, e.g., shift, over time due to a number of other mechanisms. For example, the charge storage node, e.g., floating gate, of the memory cell may lose charge over time. That is, charge may leak from the charge storage node. Such charge loss can cause the Vt of the cell to change, e.g., decrease. Additionally, as the memory cell undergoes programming and/or sensing operations over time, program disturb and/or read disturb mechanisms may cause the Vt of the cell to change, e.g., increase. Other mechanisms can also cause the Vt of the memory cell to change over time. These effects can be cumulative and may be accounted for in addition to charge settling considerations since a worn memory cell can be programmed resulting in multiple degradation modes occurring simultaneously.

In some instances, such a Vt change can alter the state of the memory cell. For example, if the memory cell were programmed to target state L2, e.g., data 00, charge loss could cause the Vt of the memory cell to decrease to a level less than $R2_0$, or possibly to a level within Vt 322 corresponding to state L1, e.g., data 01. Accordingly, such a Vt change can result in erroneous data being sensed during a sensing operation performed on the memory cell using the sensing voltages illustrated in FIG. 3, e.g., read voltages $R1_0$, $R2_0$, and $R3_0$. For example, performing a sensing operation using the sensing voltages illustrated in FIG. 3 may result in a determination that the memory cell represents a state other than the target state to which the cell was programmed. For instance, a sensing operation performed on a memory cell that was programmed to target state L2 and has undergone charge loss may determine that the cell represents state L1, if read voltage $R2_0$ is used in the sensing operation. That is, using read voltage $R2_0$ may result in a cell programmed to store data 00 being erroneously sensed as storing data 01.

As such, sensing voltages used during sensing operations performed before the Vt change occurs, e.g., the read voltages illustrated in FIG. 3, may no longer provide accurate and/or reliable sensing of memory cells that have undergone a Vt change, e.g., charge loss. However, adjusting, e.g., changing, the sensing voltages, e.g., to sensing voltages other than those illustrated in FIG. 3, may track and/or compensate for such a Vt change, thereby providing accurate and/or reliable sensing of the memory cells that have undergone the Vt change, as will be further described herein.

Figure 4:
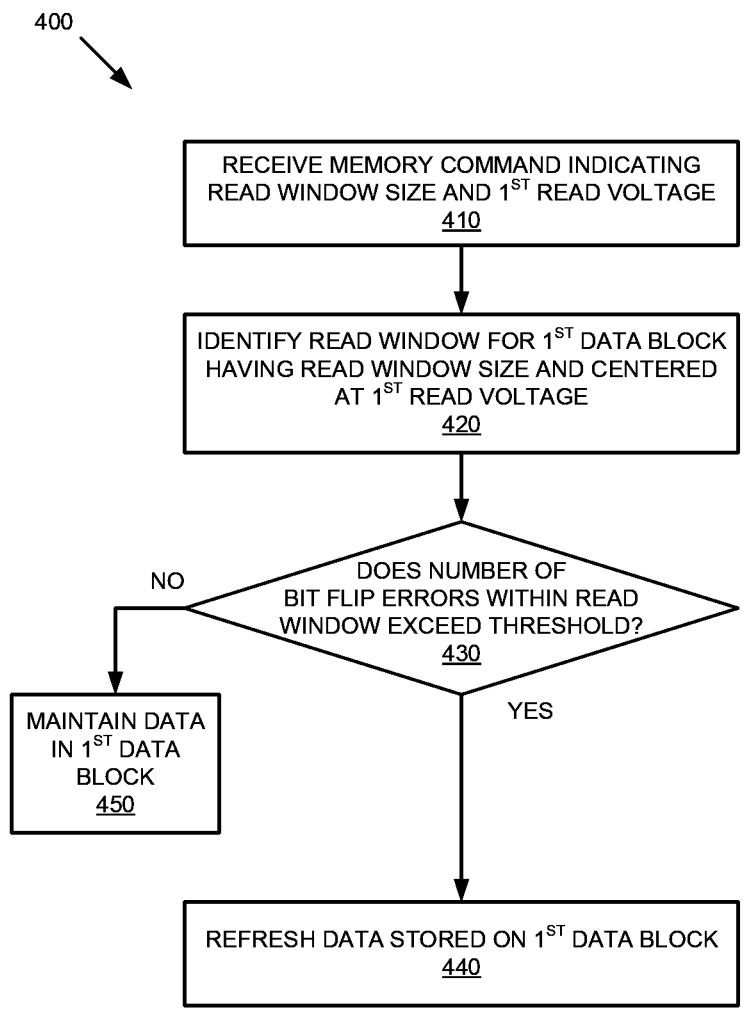
FIG. 4 is a flow diagram of an example method to determine whether to refresh a data block on a memory component based on a number of errors occurring within a read window for the data block in accordance with some embodiments of the present disclosure.

FIG. 4 is a flow diagram of an example method to determine whether to refresh a data block on a memory component based on a number of errors occurring within a read window for the data block in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the read window component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing device receives a memory command indicating a read window size and a first read voltage. In one embodiment, read window component 113 receives the memory command from at least one of host system 120 or another component within controller 115. For example, the command may include a request to determine whether, for a read window centered at the first read voltage (e.g., $R2_0$) having the read window size (e.g., 352 or 354), the number of bit flips within the read window is greater than or less than a targeted count (e.g., an error threshold). In addition, the command may include a request to determine the maximum size of the read window 352 or 354 centered at the first read voltage (e.g., $R2_0$) having less than a given bit flip count.

At operation 420, the processing device identifies a read window for a first data block of memory component 112A having the read window size and centered at the first read voltage (e.g., $R2_0$). In one embodiment, read window component 113 reduces the first read voltage by a first offset amount to form a second read voltage (e.g., $R2_1$) and applies the second read voltage to the first data block to determine a bit count associated with the second read voltage. Read window component 113 further increases the first read voltage by the first offset amount to form a third read voltage (e.g., $R2_2$) and applies the third read voltage to the first data block to determine a bit count associated with the third read voltage. In one embodiment, the difference between the second read voltage and the third read voltage represents the read window size 354. The first offset amount may be a configurable value having a fixed level or may be proportional to the size of the read window. For example, the first offset amount may be 0.1 V, 0.2 V, 0.5 V, etc. or may be equal to 10%, 20%, 25%, etc. of the read window size 354.

At operation 430, the processing device determines whether a number of bit flips for the first data block within the read window satisfies a first threshold condition pertaining to an error threshold (e.g., meets or exceeds the error threshold). In one embodiment, read window component 113 compares the bit count associated with the second read voltage to the bit count associated with the third read voltage to determine the number of bit flips for the first data block. The bit count represents the number of bits in a first state (e.g., logic 0) and the number of bits in a second state (e.g., logic 1) when the data block is read at a given read voltage. When a different read voltage is applied, the number of bits in each state may be different. This number of bits which have switched states when a different read voltage is applied can be referred to as the number of bit flips. Read window component 113 further compares the number of bit flips to the error threshold. In one embodiment, the error threshold is based on an error correction capability of the memory component 112A. The memory component 112A or memory sub-system 110 as a whole may be inherently able to correct a certain number of errors when reading or writing data to the memory components. Read window component 113 can use the number of errors that are able to be corrected (i.e., the error correction capability) to determine the error threshold, which may be stored in local memory 119. In another embodiment, the first threshold condition may include the number of bit flips being below the error threshold, such that when the number of bit flips is above the error threshold, the first threshold condition is not satisfied.

In response to the number of bit flips satisfying the first threshold condition (i.e., exceeding the error threshold), at operation 440, the processing device refreshes data stored on the first data block of the memory component 112A. In one embodiment, read window component 113 moves the data from the first data block to a second data block of the memory component 112A. Once the data has been written to the second data block, the data stored in the first data block is erased and the initial data block is available to be programmed with new data. Depending on the embodiment, the data is relocated to another data block of the same memory component 112A or to a different memory component 112N of the memory sub-system 110. If the number of bit flips does not satisfy the first threshold condition (i.e., does not exceed the error threshold), at operation 450, the processing device maintains the data in the first data block.

Figure 5:
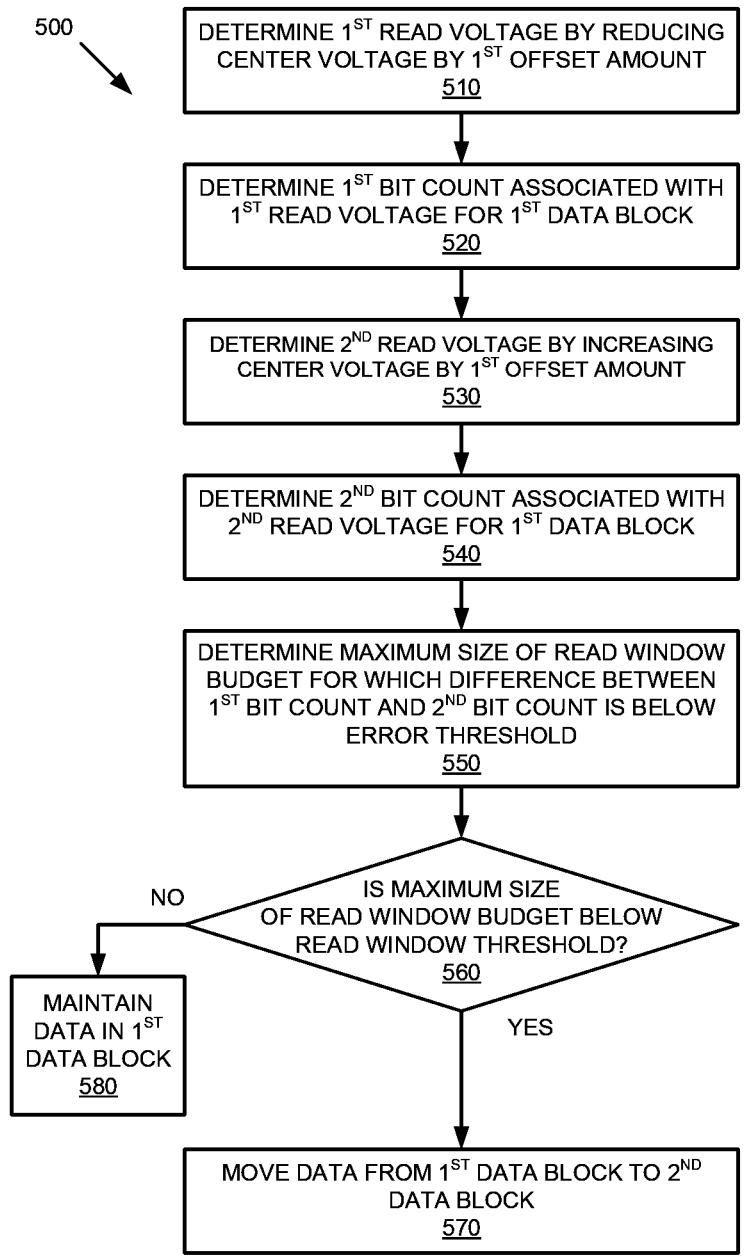
FIG. 5 is a flow diagram of an example method to determine whether to refresh a data block on a memory component based on a read window size for the data block in accordance with some embodiments of the present disclosure.

FIG. 5 is a flow diagram of an example method to determine whether to refresh a data block on a memory component based on a read window for the data block in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the read window component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing device determines a first read voltage (e.g., $R2_1$), wherein the first read voltage is a first offset amount less than a center read voltage (e.g., $R2_0$) of the read window 354. In one embodiment, read window component 113 reduces the center read voltage (e.g., $R2_0$) by the first offset amount to form the first read voltage (e.g., $R2_1$).

At operation 520, the processing device determines a first bit count for a first data block of a memory component, wherein the first bit count is associated with a first read voltage. In one embodiment read window component 113 applies the first read voltage to one or more of word lines 205-1 to 205-N of memory array 201 and reads an output voltage on one or more of local bit lines 207-1 to 207-M. The output voltage on each of the local bit lines 207-1 to 207-M corresponds to either a first state (e.g., logic 0) or a second state (e.g., logic 1). The number of values in the first state and/or the number of values in the second state together make up the bit count corresponding to the first read voltage.

At operation 530, the processing device determines a second read voltage (e.g., $R2_2$), wherein the second read voltage is the first offset amount greater than the center read voltage (e.g., $R2_2$). In one embodiment, read window component 113 increases the center read voltage (e.g., $R2_0$) by the first offset amount to form the second read voltage (e.g., $R2_2$).

At operation 540, the processing device determines a second bit count for the first data block, wherein the second bit count is associated with a second read voltage. In one embodiment, read window component 113 applies the second read voltage to one or more of word lines 205-1 to 205-N and reads a corresponding output voltage on one or more of local bit lines 207-1 to 207-M. The output voltage on each of the local bit lines 207-1 to 207-M corresponds to either a first state (e.g., logic 0) or a second state (e.g., logic 1). The number of values in the first state and/or the number of values in the second state together make up the bit count corresponding to the second read voltage. In one embodiment, the difference between the first read voltage (e.g., $R2_1$) and the second read voltage (e.g., $R2_2$) defines the read window 354.

At operation 550, the processing device determines a maximum size of the read window for which a difference between the first bit count and the second bit count satisfies a first threshold condition pertaining to an error threshold (i.e., is below the error threshold). In one embodiment, read window component 113 performs the operations described below with respect to method 600 illustrated in FIG. 6 in order to determine the maximum size of the read window. For example, some number (i.e., N, where N is 2, 4, 10, 20, etc.) of read voltages are applied in a similar way, with each read voltage resulting in a separate bit flip count. Based on the bit flip count for each of the N read voltages, read window component 113 can compute the read window for which the number of bit flips is less than the error threshold. In one embodiment, read window component 113 computes the number of bit flips for different read voltage settings, creates a bit flip histogram, analyzes the histogram, and figures out the read voltage range for which the number of bit flips does not exceed the error threshold.

At operation 560, the processing device determines whether the maximum size of the read window satisfies a second threshold condition pertaining to a read window threshold (i.e., is below a read window threshold). In one embodiment, read window component 113 compares the maximum size determine at operation 550 to the read window threshold. The read window threshold represents a read window size associated with one or more benchmarks of the memory component 112A. For example, one benchmark of memory component 112A is that it can be non-operable (e.g., powered off) for up to a period of one year with the data stored on the memory component 112A still being recoverable. Thus, if the space between voltage distributions representing different data values (i.e., the size of the read window) is too small (e.g., bellow the read window threshold) a shift in the voltage distributions may cause the distributions to collide or overlap. The larger that the space between the voltage distributions is, the more voltage shift can be tolerated, and thus the longer the period of non-operation can be.

In response to the maximum size of the read window satisfying the second threshold condition (i.e., being below the read window threshold), at operation 570, the processing device moves data from the first data block to a second data block of the memory component 112A. Once the data has been written to the second data block, the data stored in the first data block is erased and the initial data block is available to be programmed with new data. Depending on the embodiment, the data is relocated to another data block of the same memory component 112A or to a different memory component 112N of the memory sub-system 110. In response to the maximum size of the read window not satisfying the second threshold condition (i.e., exceeding the read window threshold), at operation 580, the processing device maintains the data in the first data block.

Figure 6:
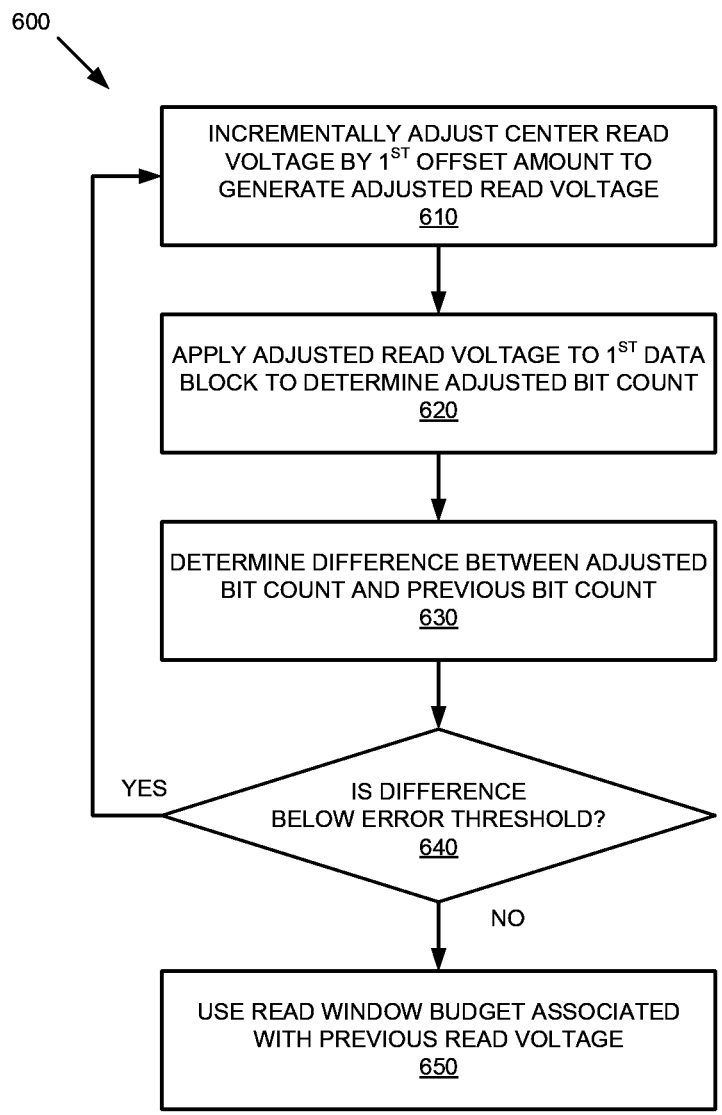
FIG. 6 is a flow diagram of an example method to determine the size of a read window size for a data block in accordance with some embodiments of the present disclosure.

FIG. 6 is a flow diagram of an example method to determine the size of a read window for a data block in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the read window component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 610, the processing device incrementally adjusts a center read voltage (e.g., $R2_0$) by a first offset amount to generate an adjusted read voltage. For example, read window component 113 reduces the center read voltage by a first offset amount to form a first read voltage (e.g., $R2_1$) or increases the center read voltage by the first offset amount to form a second read voltage (e.g., $R2_2$). The first offset amount may be a configurable value having a fixed level or may be proportional to the size of the read window. For example, the first offset amount may be 0.1 V, 0.2 V, 0.5 V, etc. or may be equal to 10%, 20%, 25%, etc. of the read window size 354. In one embodiment, read window component 113 generates two adjusted read voltages by both increasing and decreasing the center read voltage, the two adjust read voltages defining an adjusted read window.

At operation 620, the processing device applies the adjusted read voltage to the first data block to determine an adjusted bit count associated with the adjusted read voltage. In one embodiment read window component 113 applies the adjusted read voltage to one or more of word lines 205-1 to 205-N of memory array 201 and reads an output voltage on one or more of local bit lines 207-1 to 207-M. The output voltage on each of the local bit lines 207-1 to 207-M corresponds to either a first state (e.g., logic 0) or a second state (e.g., logic 1). The number of values in the first state and/or the number of values in the second state together make up the adjusted bit count corresponding to the adjusted read voltage.

At operation 630, the processing device determines a difference between the adjusted bit count and a previous bit count. In one embodiment, read window component 113 compares the bit count associated with the adjusted read voltage to the bit count associated with the previous read voltage to determine the number of bit flips resulting from the adjusted read voltage. The bit count represents the number of bits in a first state (e.g., logic 0) and the number of bits in a second state (e.g., logic 1) when the data block is read at a given read voltage. When a different read voltage is applied, the number of bits in each state may be different. This number of bits which have switched states when a different read voltage is applied can be referred to as the number of bit flips.

At operation 640, the processing device determines whether a difference between the adjusted bit count and a previous bit count is below the error threshold. In one embodiment, read window component 113 further compares the number of bit flips to the error threshold. In one embodiment, the error threshold is based on an error correction capability of the memory component 112A. The memory component 112A or memory sub-system 110 as a whole may be inherently able to correct a certain number of errors when reading or writing data to the memory components. Read window component 113 can use the number of errors that are able to be corrected (i.e., the error correction capability) to determine the error threshold, which may be stored in local memory 119.

If the difference between the adjusted bit count and a previous bit count is below the error threshold, the process returns to operations 610 and further incrementally adjusts the previous adjusted read voltage. Operations 610-640 are repeated until the difference between the adjusted bit count and a previous bit count meets or exceeds the error threshold. In one embodiment, the read window is not defined by just the bit counts of two read samples, but is obtained issuing N number of read samples (at different offsets), counting the 0s and 1s for each read sample, and concurrently analyzing the N samples. For example there may be more than two read voltage samples for which the bit flip count is less than the error threshold, in this case, the read window is defined by the range of these multiple read voltage samples. In response to the difference between the adjusted bit count and a previous bit count meeting or exceeding the error threshold, at operation 650, the processing device determines the maximum read window as that associated with the previous read voltage. Since the most recently tested adjusted read window was too large (i.e., the number of bit flips within the adjusted read window exceeded the error threshold, the previously tested read window for which the number of bit flips was below the error threshold can be considered the maximum size. In another embodiment, read window component 113 may reduce the read window size by a second offset amount (e.g., an amount that is smaller than the first offset amount) and repeat the operations 620-640 in order to more finely tune the maximum read window size.

In one embodiment, operations 620-650 are performed with respect to a single center read voltage (e.g., $R2_0$). In other embodiments, read window component 113 performs operations 620-650 for additional or all of the center read voltages (e.g., $R1_0$, $R3_0$) that distinguish between states L0, L1, L2, and L3. When a read window is determined using multiple center read voltages, read window component 113 may determine a representative read window for the corresponding memory cell or block by combining (e.g., averaging) the individual read windows. In another embodiment, the smallest individual read window may be used as the representative read window for the memory cell or block.

Figure 7:
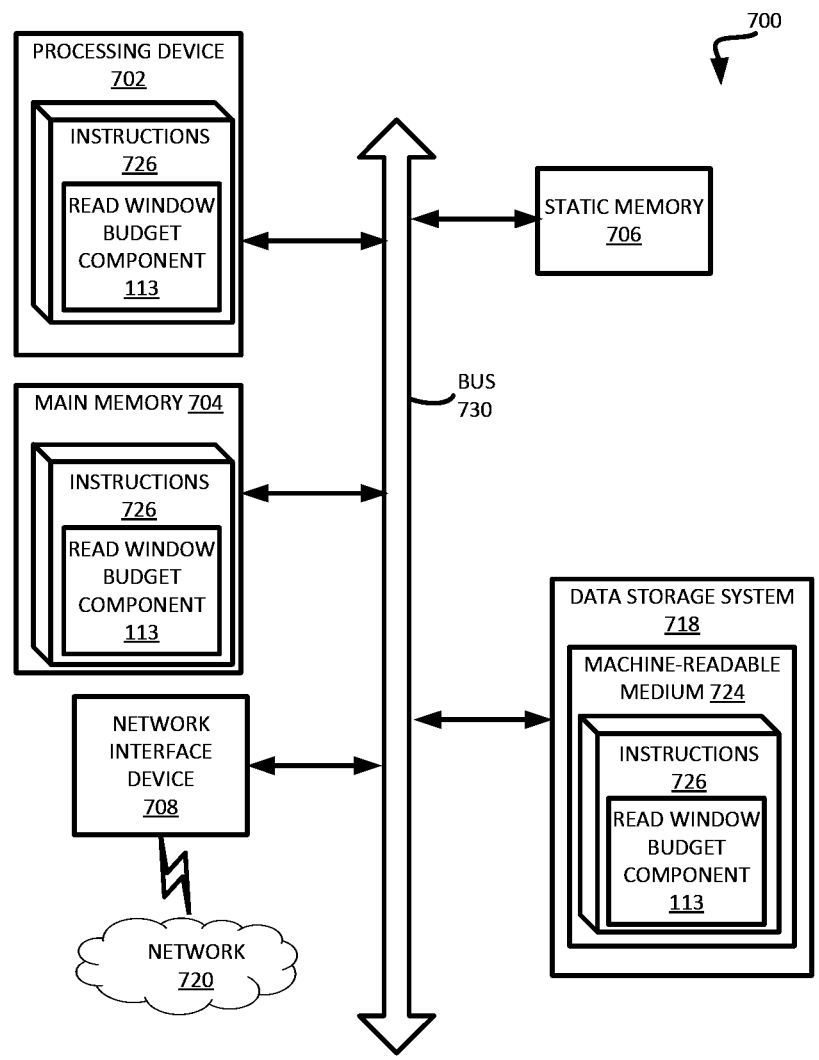
FIG. 7 is a block diagram of an example computer system in which embodiments of the present disclosure may operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the read window component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to the read window component 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled with the memory device, to perform operations comprising:
incrementally adjusting a center read voltage for a first block of the memory device by a first offset amount to generate an adjusted read voltage;
causing the adjusted read voltage to be applied to the first block to determine an adjusted bit count associated with the adjusted read voltage;
determining whether a difference between the adjusted bit count and a previous bit count associated with a previous read voltage satisfies a first threshold criterion pertaining to an error threshold; and
responsive to the difference between the adjusted bit count and the previous bit count not satisfying the first threshold criterion, determining a read window for the first block based on the previous read voltage.

2. The system of claim 1, wherein incrementally adjusting the center read voltage comprises reducing the center read voltage by the first offset amount.

3. The system of claim 1, wherein incrementally adjusting the center read voltage comprises increasing the center read voltage by the first offset amount.

4. The system of claim 1, wherein incrementally adjusting the center read voltage comprises:
increasing the center read voltage by the first offset amount to generate a first adjusted read voltage; and
decreasing the center read voltage by the first offset amount to generate a second adjusted read voltage.

5. The system of claim 1, wherein causing the adjusted read voltage to be applied to the first block to determine an adjusted bit count associated with the adjusted read voltage comprises causing the adjusted read voltage to be applied to one or more word lines of an array of the memory device and causing an output voltage to be read on one or more local bit lines of the memory array, wherein the output voltage corresponds to one of a first state or a second state.

6. The system of claim 5, wherein a number of output voltage values in one of the first state or the second state represent the adjusted bit count associated with the adjusted read voltage.

7. The system of claim 1, wherein the difference between the adjusted bit count and the previous bit count satisfies the first threshold criterion when the difference is less than the error threshold.

8. The system of claim 1, wherein the processing device to perform operations further comprising:
responsive to the difference between the adjusted bit count and the previous bit count satisfying the first threshold criterion, incrementally adjusting the adjusted read voltage by a second offset amount.

9. A method comprising:
incrementally adjusting a center read voltage for a first block of a memory device by a first offset amount to generate an adjusted read voltage;
causing the adjusted read voltage to be applied to the first block to determine an adjusted bit count associated with the adjusted read voltage;
determining whether a difference between the adjusted bit count and a previous bit count associated with a previous read voltage satisfies a first threshold criterion pertaining to an error threshold; and
responsive to the difference between the adjusted bit count and the previous bit count not satisfying the first threshold criterion, determining a read window for the first block based on the previous read voltage.

10. The method of claim 9, wherein incrementally adjusting the center read voltage comprises reducing the center read voltage by the first offset amount.

11. The method of claim 9, wherein incrementally adjusting the center read voltage comprises increasing the center read voltage by the first offset amount.

12. The method of claim 9, wherein incrementally adjusting the center read voltage comprises:
increasing the center read voltage by the first offset amount to generate a first adjusted read voltage; and
decreasing the center read voltage by the first offset amount to generate a second adjusted read voltage.

13. The method of claim 9, wherein causing the adjusted read voltage to be applied to the first block to determine an adjusted bit count associated with the adjusted read voltage comprises causing the adjusted read voltage to be applied to one or more word lines of an array of the memory device and causing an output voltage to be read on one or more local bit lines of the memory array, wherein the output voltage corresponds to one of a first state or a second state.

14. The method of claim 13, wherein a number of output voltage values in one of the first state or the second state represent the adjusted bit count associated with the adjusted read voltage.

15. The method of claim 9, wherein the difference between the adjusted bit count and the previous bit count satisfies the first threshold criterion when the difference is less than the error threshold.

16. The method of claim 9, further comprising:
responsive to the difference between the adjusted bit count and the previous bit count satisfying the first threshold criterion, incrementally adjusting the adjusted read voltage by a second offset amount.

17. A non-transitory computer-readable storage medium comprising instructions that, when executed by a processing device, cause the processing device to perform operations comprising:
incrementally adjusting a center read voltage for a first block of a memory device by a first offset amount to generate an adjusted read voltage;
causing the adjusted read voltage to be applied to the first block to determine an adjusted bit count associated with the adjusted read voltage;
determining whether a difference between the adjusted bit count and a previous bit count associated with a previous read voltage satisfies a first threshold criterion pertaining to an error threshold; and
responsive to the difference between the adjusted bit count and the previous bit count not satisfying the first threshold criterion, determining a read window for the first block based on the previous read voltage.

18. The non-transitory computer-readable storage medium of claim 17, wherein causing the adjusted read voltage to be applied to the first block to determine an adjusted bit count associated with the adjusted read voltage comprises causing the adjusted read voltage to be applied to one or more word lines of an array of the memory device and causing an output voltage to be read on one or more local bit lines of the memory array, wherein the output voltage corresponds to one of a first state or a second state.

19. The non-transitory computer-readable storage medium of claim 18, wherein a number of output voltage values in one of the first state or the second state represent the adjusted bit count associated with the adjusted read voltage.

20. The non-transitory computer-readable storage medium of claim 17, wherein the instructions cause the processing device to perform operations further comprising:
   responsive to the difference between the adjusted bit count and the previous bit count satisfying the first threshold criterion, incrementally adjusting the adjusted read voltage by a second offset amount.

* * * * *